United States Patent
Laine

(10) Patent No.: US 9,304,219 B2
(45) Date of Patent: Apr. 5, 2016

(54) ACQUISITION DEVICE PROVIDED WITH MEANS FOR DETECTING A DISCONNECTION OF A SET OF AT LEAST ONE ANALOG SEISMIC SENSOR

(71) Applicant: Sercel, Carquefou (FR)

(72) Inventor: Jerome Laine, Sautron (FR)

(73) Assignee: SERCEL, Carquefou (FR)

( * ) Notice: Subject to any disclaimer, the term of this patent is extended or adjusted under 35 U.S.C. 154(b) by 258 days.

(21) Appl. No.: 14/160,052

(22) Filed: Jan. 21, 2014

(65) Prior Publication Data
US 2014/0204703 A1    Jul. 24, 2014

(30) Foreign Application Priority Data

Jan. 21, 2013    (EP) ..................................... 13305072

(51) Int. Cl.
| | |
|---|---|
| *G01V 1/22* | (2006.01) |
| *G01V 1/00* | (2006.01) |
| *G01V 1/16* | (2006.01) |
| *G01V 13/00* | (2006.01) |
| *G01R 31/02* | (2006.01) |

(52) U.S. Cl.
CPC .. *G01V 1/22* (2013.01); *G01V 1/00* (2013.01); *G01V 1/162* (2013.01); *G01R 31/026* (2013.01); *G01V 13/00* (2013.01); *G01V 2200/14* (2013.01)

(58) Field of Classification Search
CPC ........... G01V 1/22; G01V 1/00; G01V 1/162; G01V 13/00; G01V 2200/14; G01R 31/026
USPC .......................................................... 367/14
See application file for complete search history.

(56) References Cited

U.S. PATENT DOCUMENTS

| | | |
|---|---|---|
| 4,184,143 A | 1/1980 | Stafford |
| 4,276,619 A | 6/1981 | Rickenbacker |
| 4,298,969 A | 11/1981 | Rickenbacker |
| 5,058,080 A | 10/1991 | Siems et al. |

FOREIGN PATENT DOCUMENTS

GB        1550798 A    8/1979

OTHER PUBLICATIONS

European Search Report and Written Opinion dated Jun. 13, 2013 for corresponding European Application No. 13 30 5072, filed Jan. 21, 2013.

*Primary Examiner* — Daniel L Murphy
(74) *Attorney, Agent, or Firm* — David D. Brush; Westman Champlin & Koehler, P.A.

(57) ABSTRACT

An acquisition device includes a pair of input terminals for connection to an analog seismic sensor generating a seismic signal. The device includes a detector for detecting a disconnection of the sensor, which includes a current source for injecting a low current in the sensor to generate an offset signal which depends on electrical resistance of the sensor and is added to the seismic signal. The offset signal encroaches on only a part of an operating range of the acquisition device. The voltage measured at the input terminals is applied to an analog-digital converter and a filter to obtain a measured value of the offset signal. A processing unit either analyzes a temporal variation of the measured value and triggers an alarm if a determined condition is satisfied, or transmits the measured value to a remote device adapted to analyze the temporal variation.

9 Claims, 4 Drawing Sheets

ACQUISITION DEVICE PROVIDED WITH MEANS FOR DETECTING A DISCONNECTION OF A SET OF AT LEAST ONE ANALOG SEISMIC SENSOR

1. FIELD OF THE INVENTION

The field of the invention is that of seismic data acquisition.

More specifically, the invention relates to a technique for detecting a partial or total disconnection of a set of at least one analog seismic sensor, from an acquisition device comprising a pair of input terminals adapted to be connected to this set of at least one analog seismic sensor.

A particular application of the invention relates to land seismic data acquisition systems.

The invention can be applied in particular in the industry of oil exploration by seismic method, but may be applied to any field implementing a seismic data acquisition.

2. TECHNOLOGICAL BACKGROUND

Seismic data acquisition systems conventionally use cabled networks comprising electronic units whereto ground movement sensors are connected.

FIG. 1 illustrates schematically a seismic data acquisition system according to a first known solution, based on the use of analog sensors 4.

For the sake of simplification, each reference 4 designates an analog sensor and its corresponding housing and casing (as detailed below with FIG. 2).

To collect the seismic data (geophysical data), one or a plurality of seismic sources (not shown in FIG. 1) in contact with the ground are activated to propagate omni-directional seismic wave trains. The sources may among other things consist of explosives, falling weights, vibrators or air guns in marine environments. The wave trains reflected by the layers of the subsurface are detected by the analog sensors 4, which generate an analog signal characterising the reflection of the waves on the geological interfaces of the subsurface.

The analog sensors 4 are generally referred to using the term "analog geophones". As shown in the example of FIG. 2, they are generally interconnected in groups of sensors by a two-conductor line 5 (or a three-conductor line for a serial-parallel configuration) to form clusters referred to as "strings of analog geophones" (or "geophone strings") 33. To this end, each analog geophone is mounted in a mechanical housing (or cartridge) 62. This mechanical housing 62 of analog sensor is inserted with mechanical tolerances inside a casing 61 (made of plastic in general) which shape is dependent of the type of area to investigate (marsh, land . . . ). The two-conductor line 5 is usually moulded to the casing 61. Each of the strings 33 is connected to an acquisition device 3. To this end, the acquisition device 3 is also mounted in a mechanical housing which comprises a connector 63 with two contacts, adapted to cooperate with a connector 64 of the same type placed on the two-conductor line 5 (i.e. the cable of the string).

The acquisition devices 3 are generally referred to using the term "Digitizer Unit". They are interconnected wirelessly or by a cabled network (e.g. a four-conductor line), perform the analog to digital conversion of analog signals coming from the groups of sensors and send the resulting digital seismic data to a central recording system 1 (also referred to using the term "central data processing unit"), via intermediate collection devices 2 (also referred to using the term "concentrator device"). The central recording system 1 is usually onboard a recording truck. The acquisition devices 3 also performs other functions, notably: synchronisation with the central recording system 1, processing of the seismic signal and interfacing with the digital network (i.e. transferring seismic data to the central recording system 1, receiving and processing commands received from the central recording system 1).

The arrangement of analog geophones to form a geophone string 33 depends on the useful signal level noise level and the level of spatial filtering required, which themselves depend on the soil type and varies from one mission to another.

It is common practice to assemble, in series and/or in parallel, a plurality of geophones to form a geophone string 33, since:
- geophones connected in series allow to amplify the signal (more the signal is weak, the greater the number Ns of geophones in series must be; however the number Ns should not be too great, not to overload the input);
- geophones connected in parallel allow to get a low impedance and be immune to electrical noise.

A serial or parallel configuration of a plurality of geophones allows to filter the noise (the more you want to filter the noise, the greater the number of geophones in series Ns and/or parallel Np must be; the limit is a compromise between cost and performance).

In a first example, a geophone string 33 comprises Ns geophones in series. The resistance of this geophone string 33 is: Rstring=Rgeo×Ns, with Rgeo the resistance of one geophone.

In a second example, a geophone string 33 comprises Np geophones in parallel. The resistance of this geophone string 33 is: Rstring=Rgeo/Np.

In a third example, a geophone string 33 comprises Np branches in parallel, each branch comprising Ns geophones in series. The resistance of this geophone string 33 is: Rstring=Rgeo×Ns/Np.

Many other examples of geophone strings can be considered.

For reasons of ease and speed of implementation, the aforesaid connectors 63, 64 (used to connect each geophone string 33 to an acquisition device 3) do not have locking ring. To achieve a spatial filtering, the set of geophones (analog seismic sensors) which are connected (via one or several geophone strings) to an acquisition device are commonly deployed on hundreds of m² and are therefore subject to numerous mechanical constraints (vehicles, animals . . . ) and climatic constraints, which can induce an unintentional disconnection of all or part of the geophone strings, or a break of the cable connecting the geophones together and to the acquisition device. It is therefore necessary to provide the system operators with a solution to remotely monitor the correct connection of the geophone strings, in order to allow maintenance or warn about the poor quality of the data produced by the acquisition device. This warning information can be used during the processing of the complete data.

A known solution is now described with FIGS. 3 and 4 in which a geophone string 33 is connected to an acquisition device 3, and the acquisition device is configured either in acquisition mode (FIG. 3) or in test mode (FIG. 4). In this example, the geophone string 33 comprises five geophones 4 connected in parallel.

The acquisition device 3 comprises:
- a pair of input terminals 38a, 38b to which is connected the geophone string 33;
- a passive filter 34 for filtering the noise;
- an analog-digital converter (ADC) 35;
- a processor 36 (e.g. a microprocessor or a microcontroller);

a current generator 37a, 37b (shown only in FIG. 4, since it is used only in the test mode).

In the acquisition mode illustrated in FIG. 3, the voltage U between the input terminals 38a, 38b represents an analog useful seismic signal generated by the set of geophones 4 of the geophone string 33. Said useful signal coming from geophones comprises no offset signal. The processor 36 processes the signal 310 resulting from the filtering (by passive filter 34) and the analog to digital conversion (by the ADC 35) of this analog useful seismic signal, and generates a digital useful seismic signal 39.

In the test mode illustrated in FIG. 4, a current I is injected by the current generator 37a, 37b into the geophone string 33. The voltage U between the input terminals 38a, 38b represents an analog test signal which depends on an equivalent resistance Req: U=Req*I, with Req a resistance equivalent to Rstring in parallel with Rin, with Rstring the resistance of the entire set of geophones 4 of the geophone string 33 and Rin the input resistance of the acquisition device 3:

$$Req = \frac{Rin \times Rstring}{Rin + Rstring}$$

The processor 36 processes the signal 41 resulting from the filtering (by passive filter 34) and the analog to digital conversion (by the ADC 35) of this analog test signal, and generates a value 40 of Rstring (since I and Rin are known, the value of Rstring can be deduced).

The above known solution (illustrated in FIGS. 3 and 4) has several drawbacks detailed below.

Measuring the resistance Rstring (by current injection) cannot be carried out in operation, i.e. during an acquisition, because this measuring interferes with the geophones (because injected current I overrides useful seismic signal from geophones). Therefore the measuring of the resistance Rstring is usually performed only twice a day and when seismic data acquisition system is in standby between two seismic acquisitions. However, acquisition systems are increasingly used in continuous acquisition (24 h/24 h), which does not allow performing regular resistance test, in order to detect continuously any accidental disconnection of all or part of the geophone strings 33 that would lead to a drastic degradation of seismic signal quality.

Because of changes of the resistance Rstring as a function of the temperature and because of the disparity in the resistance values, the known solution can lead to false alarms and provides good results only by comparing the resistance value obtained by a given acquisition device (to which is connected e.g. one geophone string) with the average value of the measured resistance values obtained by other acquisition devices (to each of which is connected e.g. one other geophone string).

In the known solution, an absolute measuring of the resistance Rstring is made. This absolute measuring must be precise to discriminate the correct number of connected geophones. Therefore, to be robust to noise, it is necessary to inject a high level current. For example, if we consider a geophone string having a typical configuration with six geophones in parallel, with the aim to continuously check that there is six geophones connected (i.e. a geophone string resistance: Rstring=Rgeo/6, with Rgeo the resistance of each geophone), we must be able to measure the resistance Rstring of the geophone string with an accuracy of Rgeo/6 and compare the measured resistance value to a theoretical resistance value. This means being very sensitive to noise, and therefore use a high level current.

In addition, if one includes the effects of temperature on the value of the resistance (+/−20% of the range of the resistance), the comparison with a theoretical resistance value is impossible. It is therefore necessary to make a comparison with the measured resistance values obtained with all the other acquisition devices, which is difficult and even impossible in the context of autonomous acquisition devices.

3. SUMMARY OF THE INVENTION

A particular embodiment of the invention proposes an acquisition device comprising a pair of input terminals adapted to be connected to a set of at least one analog seismic sensor generating a useful seismic signal, and disconnection detection means enabling to detect a partial or total disconnection of the set of at least one analog seismic sensor. The disconnection detection means comprise:
  means for injecting a low current in the set of at least one analog seismic sensor, in order to generate an offset signal which depends partially on the electrical resistance of the set of at least one analog seismic sensor and is added to the useful seismic signal, said offset signal encroaching on only a part of an operating range of the acquisition device;
  an analog-digital converter and filtering means, for converting and filtering a voltage measured at the pair of input terminals, in order to obtain a measured value of the offset signal;
and:
  either means for analysing a temporal variation of the measured value of the offset signal and for triggering an alarm if a determined condition is satisfied,
  or means for transmitting the measured value of the offset signal to a remote device adapted to analyse a temporal variation of the measured value of the offset signal and to trigger an alarm if a determined condition is satisfied.

The general principle is to replace an absolute resistance measuring (with a comparison to a theoretical resistance value) by a relative resistance measuring (with an analysis of a temporal variation of the offset signal). A rapid variation of the resistance (Rstring) of the entire set of analog seismic sensor or sensors will be trapped and an alarm triggered (to indicate a disconnection).

Since the decision is based on a temporal variation and not on an absolute value, there is no need for a precision as high as in the solution of the prior art. With the present invention, we make a continuous measurement relative to previous values (the factors of errors, which remain constant from one moment to the other, cancel each other), while in prior art solution an absolute measurement is performed and this measurement is compared with respect to a theoretical value. The test signal (i.e. the offset signal) of the present invention can have a lower level than the test signal of the prior art solution (as detailed below, this avoids to encroach on the amplitude of the useful seismic signal). It is possible to carry out the disconnection detection, continuously and simultaneously with the acquisition.

Moreover, the acquisition device takes the alarm triggering decision independently of other acquisition devices, therefore the proposed solution is compatible with the use of autonomous acquisition devices.

According to a particular feature, the means for filtering comprise a digital high-pass filter having a cut-off frequency enabling to separate the offset signal and the useful seismic signal, respectively below and above the cut-off frequency.

Thus the filtering is easy to carry out.

According to a particular feature, the means for filtering comprise an infinite impulse response digital filter.

Thus the filtering is easy to carry out. Moreover, the infinite impulse response (IIR) digital filter can carry out an averaging which rejects the noise.

In a first particular implementation, the determined condition is a check that an amplitude of the measured value of the offset signal is above a threshold.

Thus the alarm triggering is easy to carry out.

If the given time duration is short enough (compared to the speed of variation of the resistance as a function of temperature), the proposed technique is not impacted by temperature changes.

With this first particular implementation (detecting a threshold value is exceeded), there may be temperature drifts that can toggle the value of the offset signal (Voffset) above the threshold and thus trigger a false alarm.

In a second particular implementation, the determined condition is a check that an absolute value of a slope of the measured value of the offset signal is above a threshold.

Thus this solution (detecting a change of the slope value) is optimal because fast (the criterion is the slope in mV/s). It is then possible to inject a lower current value to create the offset signal (Voffset), compared with the aforesaid first particular implementation. This allows not having to inject a large offset signal and thus encroach on only a small part of the operating range (Vfullscale) of the acquisition device (which is defined by the operating range of the analog-digital converter).

According to a particular feature, a ratio R between the offset signal and an operating range of the analog-digital converter satisfies: $0 < R \leq 99\%$.

This allows to carry out the disconnection detection, continuously and simultaneously with the acquisition.

According to a particular feature, $R \leq 1\%$

This allows a very small change in the amplitude of the useful signal. In other words, the disconnection detection is carried out continuously and simultaneously with the acquisition, but does not impact the acquisition.

According to a particular feature, $R > (SNRoffset/Vfullscale)*(Req/dR)$, where:

SNRoffset is the noise of a measurement electronics comprised in the analog-digital converter;

Vfullscale is the operating range of the analog-digital converter;

Req is the equivalent electrical resistance for the electrical resistance of the set of at least one analog seismic sensor, in parallel with the input resistance of the acquisition device; and dR is a resolution of detection, i.e. the minimum resistance change to be detected.

Thus, by choosing for the ratio a value close to the limit value, it is possible to minimize the value of the offset signal (and therefore to maximize the value of the useful signal).

Another embodiment of the invention proposes a method for detecting a partial or total disconnection of a set of at least one analog seismic sensor generating a useful seismic signal and connected to a pair of input terminals of an acquisition device. The method comprises:

injecting a low current in the set of at least one analog seismic sensor, in order to generate an offset signal which depends partially on the electrical resistance of the set of at least one analog seismic sensor and is added to the useful seismic signal, said offset signal encroaching on only a part of an operating range of the acquisition device;

filtering a voltage measured at the pair of input terminals, in order to obtain a measured value of the offset signal;

analysing a temporal variation of the measured value of the offset signal and triggering an alarm if a determined condition is satisfied.

Advantageously, the method comprises steps corresponding to the implementation of the various means of the acquisition device as described above, in any of its various embodiments.

4. LIST OF FIGURES

Other features and advantages of embodiments of the invention shall appear from the following description, given by way of an indicative and non-exhaustive examples and from the appended drawings, of which:

Figure 5:
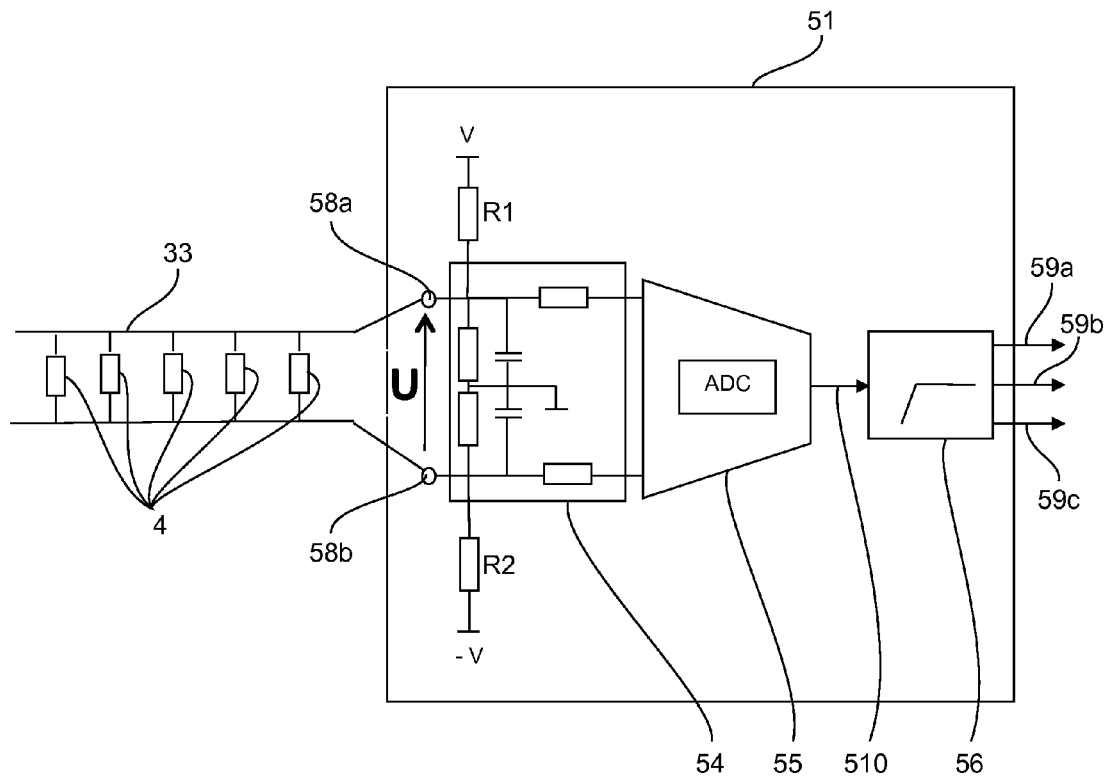
Figure 6:
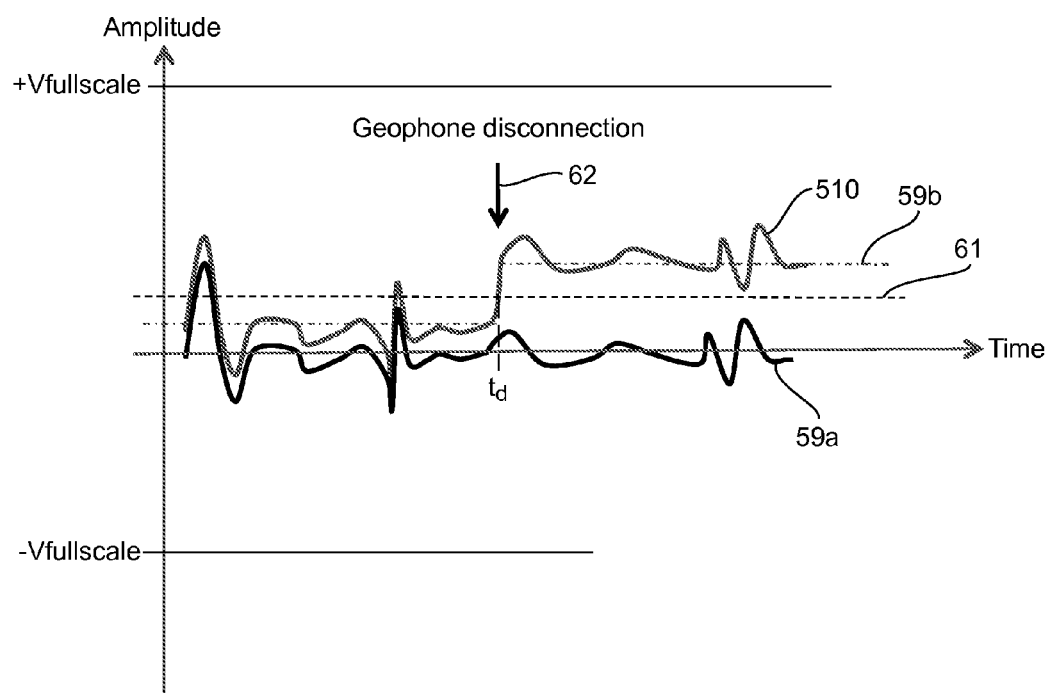

FIG. 5 illustrates a solution, according to a particular embodiment of the invention, for detecting a partial or total disconnection of a set of at least one analog seismic sensor from an acquisition device; and FIG. 6 shows an example of a global signal (sum of a useful seismic signal and an offset signal) and the corresponding offset signal, explaining the operation of the acquisition device of FIG. 5.

5. DETAILED DESCRIPTION

In all of the figures of the present document, identical elements and steps are designated by the same numerical reference sign.

FIGS. 1 to 4, which relate to the prior art, have already been described above and are not discussed again.

We now present, in relation to FIG. 5 an acquisition device 51 according to a particular embodiment of the invention, allowing to detect a partial or total disconnection of a set of at least one analog seismic sensor 4.

Figure 1:
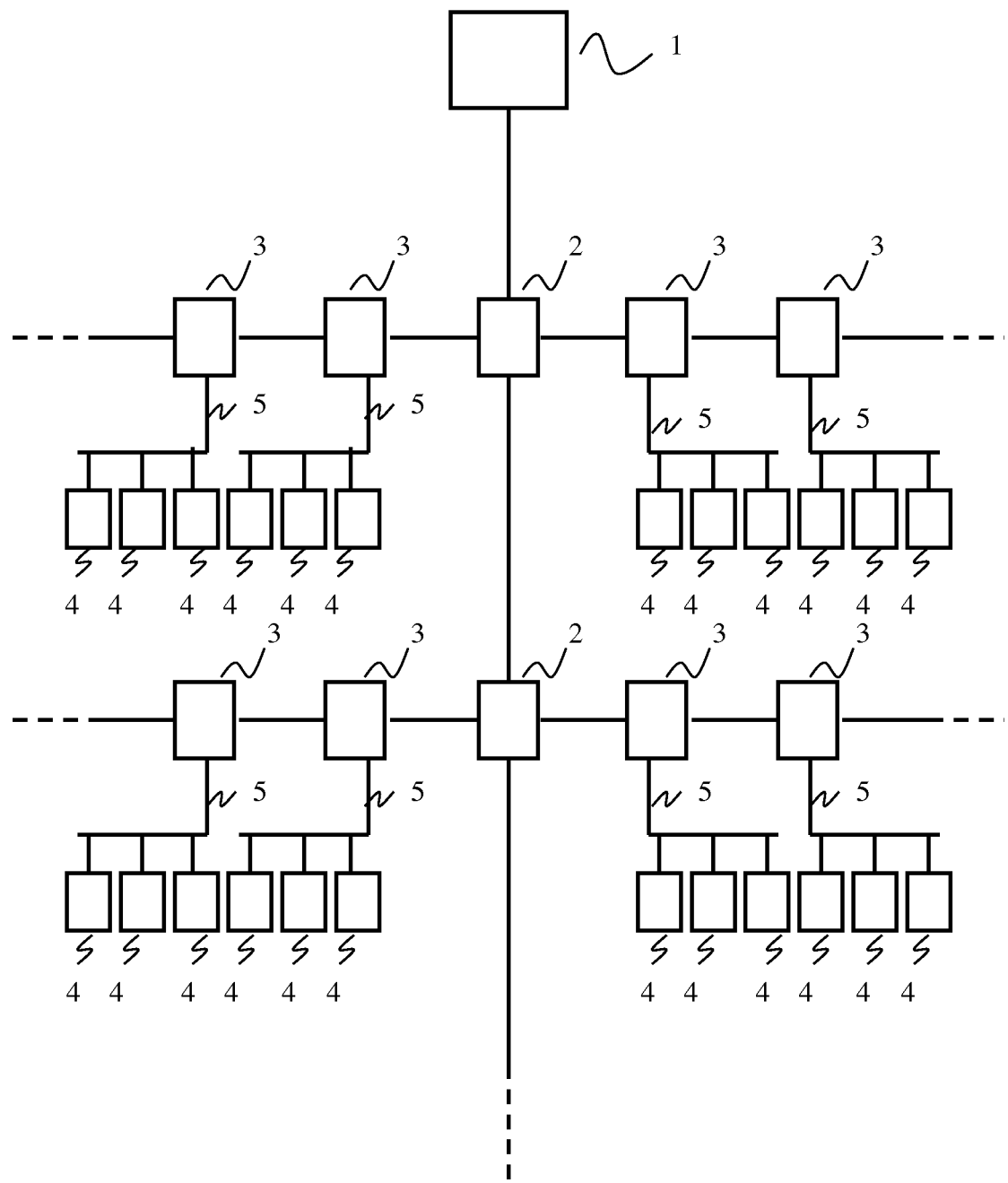
FIG. 1 illustrates schematically a seismic data acquisition system according to the prior art, based on the use of analog sensors.
Figure 2:
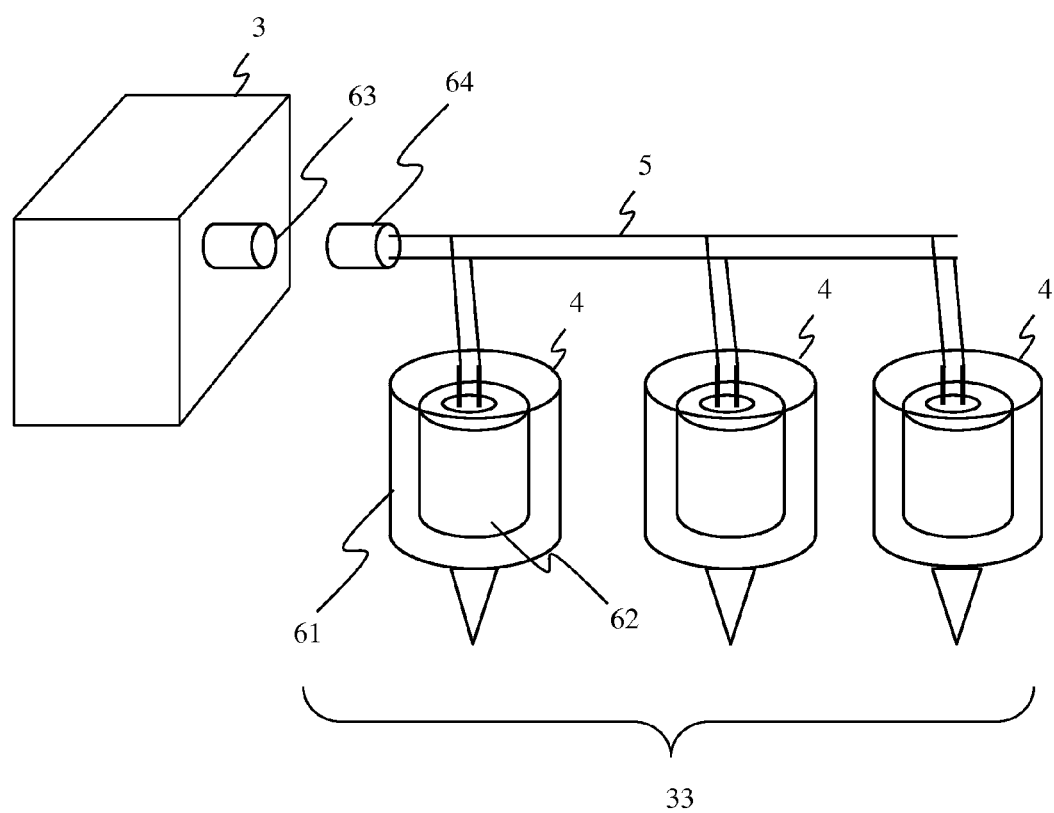
FIG. 2 illustrates schematically the connection between a string of analog geophones and an acquisition device, according to the prior art.
Figure 3:
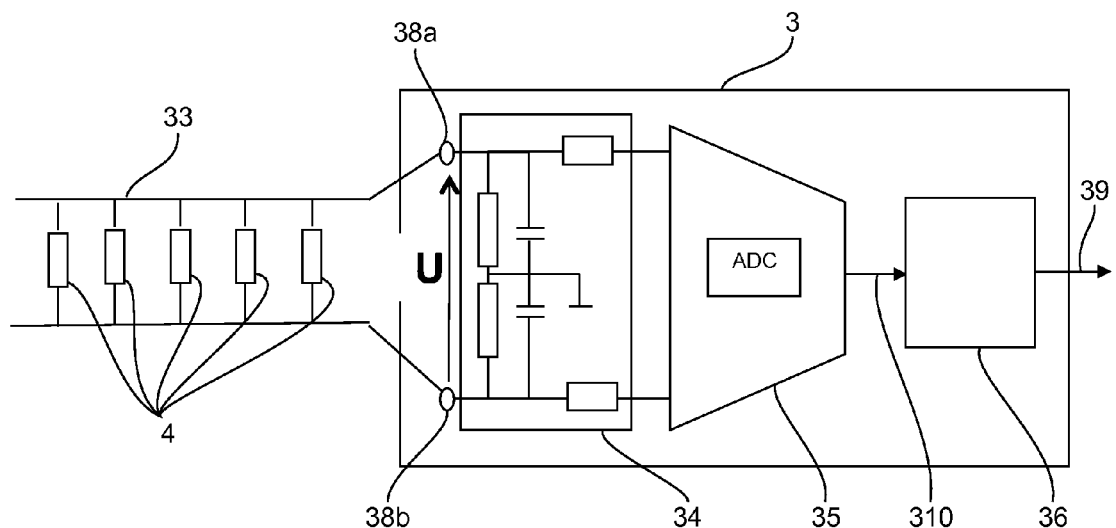
FIGS. 3 and 4 illustrate a solution, according to the prior art, for detecting a partial or total disconnection of a set of at least one analog seismic sensor from an acquisition device.
Figure 4:
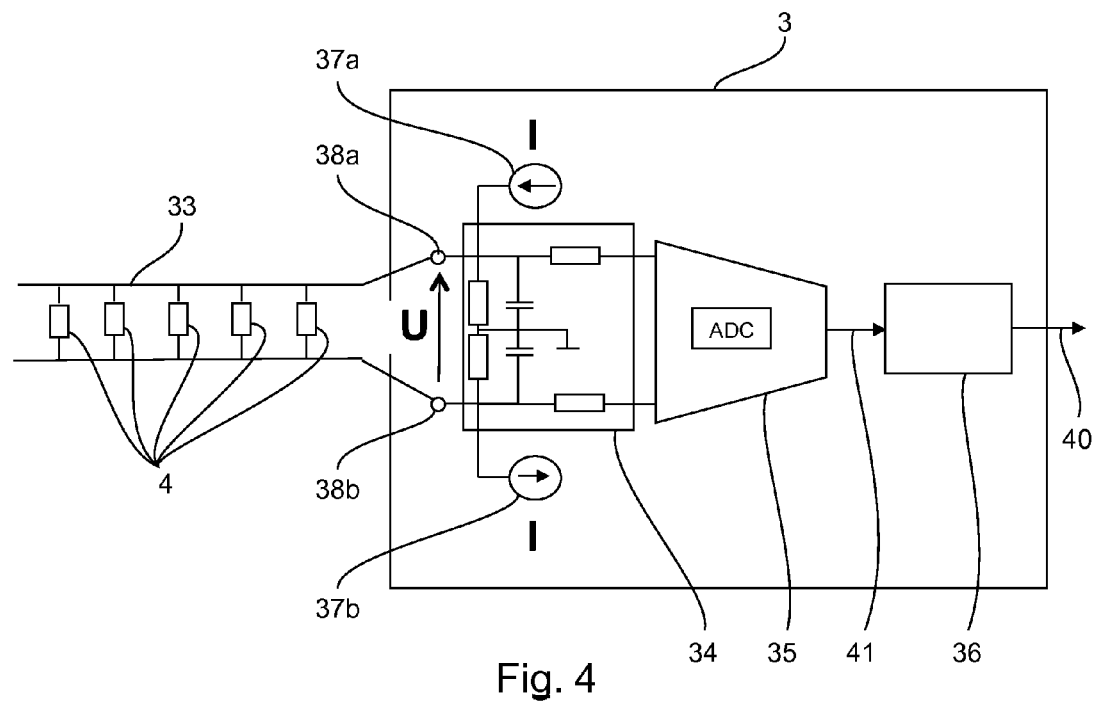

In the example of FIG. 5, and similarly to FIGS. 3 and 4, it is assumed that a geophone string 33 (comprising five geophones 4) is connected to the acquisition device.

The acquisition device 51 comprises:

a pair of input terminals 58a, 58b (identical to the pair of input terminals 38a, 38b of FIGS. 3 and 4) to which is connected the geophone string 33;

a passive filter 54 (identical to the passive filter 34 of FIGS. 3 and 4) for filtering the noise;

an analog-digital converter (ADC) 55 (identical to ADC 35 of FIGS. 3 and 4);

a processor 56 (e.g. a microprocessor or a microcontroller);

means for injecting a low current in the geophone string 33, comprising two high value resistors R1 and R2. The resistor R1 is connected to an electrical potential V on one side and to the input terminal 58a on the other side. The resistor R2 is connected to the input terminal 58b on one side and an electrical potential V on one side and to the ground on the other side.

For the electrical potential V, it is possible to simply use a supply voltage already present in the circuit board of the acquisition device.

Due to the low current injected through the resistors R1 and R2, the set of geophones 4 of the geophone string 33 generates an analog offset signal Voffset (i.e. a DC signal) which depends partially on the electrical resistance Rstring of the entire set of geophones 4 of the geophone string 33.

Indeed, we have:

$$Voffset = V \times \frac{Req}{Req + R1 + R2}$$

with Voffset equal to the voltage U between the input terminals 58a, 58b when there is no analog seismic signal (i.e. no AC signal), and Req a resistance equivalent to Rstring in parallel with Rin (Rin being the input resistance of the acquisition device 51):

$$Req = \frac{Rin \times Rstring}{Rin + Rstring}$$

We detail now three examples of numerical application, considering V=4.9V, R1=R2=3.9 Mohms, Rgeo=500 Ohms and Rin=20 kOhms.

In a first example, the geophone string 33 comprises Ns geophones in series. Rstring=Rgeo×Ns.
  If we consider Ns=6 in normal operation, we have: Voffset=1.63 mV
  If we consider Ns=5 after the disconnection of one geophone, we have: Voffset=1.395 mV In a second example, the geophone string 33 comprises Np geophones in parallel.
Rstring=Rgeo/Np.
  If we consider Np=6 in normal operation, we have: Voffset=0.000521 mV
  If we consider Np=5 after the disconnection of one geophone, we have: Voffset=0.000625 mV In a third example, the geophone string 33 comprises Np branches in parallel, each branch comprising Ns geophones in series. Rstring=Rgeo×Ns/Np.
  If we consider three branches (Np=3) each comprising 12 geophones (Ns=12) in normal operation, we have: Voffset=1.1419 mV
  If we consider the disconnection of one geophone in one branch (i.e. two branches of twelve geophones and one branch of eleven geophones: Rstring=Rgeo×12/2//Rgeo×11=6Rgeo//11Rgeo=6*11/(6+11) Rgeo=3.88Rgeo), we have: Voffset=1.1113 mV During acquisition, the analog offset signal Voffset (i.e. the DC signal) is added to an analog useful seismic signal Vuseful (i.e. a AC signal) also generated by the set of geophones 4 of the geophone string 33. Thus, during acquisition, the voltage U measured at the pair of input terminals 58a, 58b is an analog global signal resulting from the addition of the analog useful seismic signal Vuseful (AC signal) and the analog offset signal (DC signal). As previously noted, the voltage U is equal to Voffset when there is no AC signal.

The parameters (I, Rin, Rstring) are chosen so that a ratio R between the analog offset signal Voffset and an operating range (Vfullscale) of the analog-digital converter 55 (i.e. R=Voffset/Vfullscale) satisfies: 0<R≤99%.

Preferentially, R≤1%. This allows a very small change in the amplitude of the useful signal Vuseful (if we consider the maximum amplitude of the useful signal is given by: Vfullscale minus the maximum amplitude of the offset signal Voffset). In other words, the disconnection detection can be carried out continuously and simultaneously with the acquisition, but does not impact the acquisition.

Also preferentially, R>(SNRoffset/Vfullscale)*(Req/dR), where:
  SNRoffset is the noise of a measurement electronics comprised in the analog-digital converter 55;
  dR is a resolution of detection, i.e. the minimum resistance change to be detected (e.g. in order to detect the loss of one geophone in a string of six geophones in parallel, we have: dR=Rgeo/6−Rgeo/5=−Rgeo/30).

The processor 56 processes the signal 510 resulting from the filtering (by passive filter 54) and the analog to digital conversion (by the ADC 55) of this analog global signal. As detailed below, the processor 56 generates a digital useful seismic signal 59a, a digital offset signal 59b and an alarm signal 59c.

FIG. 6 shows an example of such a signal 510 (aforesaid global signal) and of the corresponding offset signal 59b and useful seismic signal 59a (the latter being obtained by offset filtering). In this example, we assume a disconnection occurs at a time $t_d$, as indicated by the arrow referenced 62.

More precisely, the processor 56 carries out the following two main steps (by execution of a set of program code instructions stored in a non-transitory computer-readable carrier medium):
  digital filtering of the signal 510, in order to obtain the digital offset signal 59b (i.e. a measured value of the offset signal) and the digital useful seismic signal 59a (i.e. a measured value of the useful seismic signal); and
  analysis of a temporal variation of the measured value of the digital offset signal 59b, allowing to trigger the alarm signal 59c if a determined condition is satisfied.

In a first implementation, the determined condition is a check that an amplitude of the digital offset signal 59b is above a first alarm trigger threshold S1 (referenced 61 in FIG. 6). In other words, an alarm is triggered if an abnormally variation of the digital offset signal 59b is detected.

In a second implementation, the determined condition is a check that an absolute value of a slope (in mV/s) of the digital offset signal 59b is above a second alarm trigger threshold S2. If the value of the second alarm trigger threshold is chosen appropriately (e.g. S2=dR×I V/s where dR is the minimum value of resistance to detect and I is the injected current), an alarm is triggered if an abnormally rapid variation of the digital offset signal 59b is detected.

Other implementations can be envisaged without departing from the scope of the present invention. Whatever implementation, the idea is to detect, continuously and simultaneously with the seismic acquisition, any abnormally variation of the digital offset signal 59b, and therefore of the electrical resistance Rstring of the entire set of geophones 4 of the geophone string 33.

In a particular embodiment, the digital filtering of the signal 510, carried out by the processor 56, is implemented as an IIR ("Infinite Impulse Response") digital filter, i.e. a digital high-pass filter having a cut-off frequency enabling to separate the digital offset signal 59b (which is below the cut-off frequency) and the digital useful seismic signal 59a (which is above the cut-off frequency). An IIR digital filter is advantageous compared to an FIR ("Finite Impulse Response") digital filter. Indeed, for such a high pass filter with a very low cut-off frequency like FIR, time computation load would be much higher because of high number of coefficients.

In a first implementation, the processor 56 performs the following calculation on a series of samples to be processed FilterIn:

FilterOut($t$)=FilterIn($t$)+Alpha*FilterOut($t$−1).

The cut-off frequency is set-up by adjusting the parameter Alpha.

In a second implementation, more efficient in terms of required computing resources and which gives directly the offset value, is as follows:

FilterOut($t$)=FilterIn($t$)−Alpha*SUM($t$−1)

with:

SUM($t$)=FilterOut($t$)+SUM($t$−1)

and Alpha a coefficient that defines the cut-off frequency.

In both implementations, filter continuously removes the offset on the fly (i.e. in real time) from raw acquisition data to get useful seismic signal. Extracted offset value is continuously monitored and an anomalous fluctuation of this value that could not be related to any normal drift (temperature, ageing, or whatever) is said to be due to an accidental disconnection of one ore many geophones in the geophones string (see above examples of determined condition used to trigger an alarm).

The offset value at t is given directly by:

Offset($t$)=Alpha*SUM($t$).

In an alternative embodiment (not shown), the processor 56 carries out only the digital filtering of the signal 510, and transmits the digital offset signal 59*b* and the digital useful seismic signal 59*a* to a remote device. This remote device carries out the analysis of the temporal variation of the digital offset signal 59*b* and triggers the alarm signal 59*c* if the determined condition is satisfied.

In another alternative embodiment (not shown) of the acquisition device, the aforesaid two main steps (digital filtering of the signal 510, and analysis of a temporal variation of the measured value of the digital offset signal 59*b* allowing to trigger the alarm signal 59*c* if a determined condition is satisfied) are not carried out by the processor 56 but by one or several dedicated machines or components comprised in the acquisition device, such as a FPGA ("Field Programmable Gate Array"), an ASIC ("Application-Specific Integrated Circuit") or any dedicated hardware component. In other words, the invention is not limited to a purely software-based implementation (e.g. in a processor), in the form of computer program instructions, but that it can also be implemented in hardware form, or any form combining a hardware portion and a software portion.

In another alternative embodiment (not shown) of the acquisition device, the means for injecting a low current (in the geophone string 33) comprise a current generator (identical to the current generator 37*a*, 37*b* of FIG. 4), which replaces R1, R2 and V in the embodiment of FIG. 5. The current level is adjusted to create the same level of offset:

$I=V/(R1+R2+Rin)$

The offset voltage induced in the equivalent resistance Req (Rstring in parallel with Rin) is:

$Voffset = I \times Req$ with $$Req = \frac{Rin \times Rstring}{Rin + Rstring}$$

An exemplary embodiment of the disclosure provides a technique for detecting a partial or total disconnection of a set of at least one analog seismic sensors (geophones distributed along one or several geophone strings) from an acquisition device, with the possibility that this technique is carried out simultaneously with the seismic acquisition.

An exemplary embodiment of the invention provides a technique of this kind that is easy to implement, at no extra cost and without field constraint.

An exemplary embodiment of the invention provides a technique of this kind that does not require to know measured values obtained by other acquisition devices, and is therefore compatible with the use of autonomous acquisition devices.

An exemplary embodiment of the invention provides a technique of this kind that does not require to inject a high level current.

An exemplary embodiment of the invention provides a technique of this kind that is not impacted by temperature changes.

Although the present disclosure has been described with reference to one or more examples, workers skilled in the art will recognize that changes may be made in form and detail without departing from the scope of the disclosure and/or the appended claims.

The invention claimed is:

1. An acquisition device comprising:
   a pair of input terminals adapted to be connected to a set of at least one analog seismic sensor generating a useful seismic signal, and
   disconnection detection means for detecting a partial or total disconnection of the set of at least one analog seismic sensor, wherein the disconnection detection means comprise:
   means for injecting a low current in the set of at least one analog seismic sensor, in order to generate an offset signal which depends partially on the electrical resistance of the set of at least one analog seismic sensor and is added to the useful seismic signal, said offset signal encroaching on only a part of an operating range of the acquisition device;
   an analog-digital converter and filter, which convert and filter a voltage measured at the pair of input terminals, in order to obtain a measured value of the offset signal; and
   at least one of:
      means for analysing a temporal variation of the measured value of the offset signal and for triggering an alarm if a determined condition is satisfied, or
      means for transmitting the measured value of the offset signal to a remote device adapted to analyse a temporal variation of the measured value of the offset signal and to trigger an alarm if a determined condition is satisfied.

2. The acquisition device according to claim 1, wherein the filter comprises a digital high-pass filter having a cut-off frequency enabling to separate the offset signal and the useful seismic signal, respectively below and above the cut-off frequency.

3. The acquisition device according to claim 1, wherein the filter comprises an infinite impulse response digital filter.

4. The acquisition device according to claim 1, wherein the determined condition is a check that an amplitude of the measured value of the offset signal is above a threshold.

5. The acquisition device according to claim 1, wherein the determined condition is a check that an absolute value of a slope of the measured value of the offset signal is above a threshold.

6. The acquisition device according to claim 1, wherein a ratio R between the offset signal and an operating range of the analog-digital converter satisfies: $0 < R \leq 99\%$.

7. The acquisition device according to claim 6, wherein: $R \leq 1\%$.

8. The acquisition device according to claim 6, wherein: $R > (SNRoffset/Vfullscale)*(Req/dR)$, where:
- SNRoffset is the noise of a measurement electronics comprised in the analog-digital converter;
- Vfullscale is the operating range of the analog-digital converter;
- Req is the equivalent electrical resistance for the electrical resistance of the set of at least one analog seismic sensor, in parallel with the input resistance of the acquisition device; and
- dR is a resolution of detection corresponding to the minimum resistance change to be detected.

9. A method comprising:

detecting a partial or total disconnection of a set of at least one analog seismic sensor generating a useful seismic signal and connected to a pair of input terminals of an acquisition device, wherein detecting comprises:

injecting a low current in the set of at least one analog seismic sensor, in order to generate an offset signal which depends partially on the electrical resistance of the set of at least one analog seismic sensor and is added to the useful seismic signal, said offset signal encroaching on only a part of an operating range of the acquisition device;

filtering a voltage measured at the pair of input terminals, in order to obtain a measured value of the offset signal;

analysing a temporal variation of the measured value of the offset signal and triggering an alarm if a determined condition is satisfied.

* * * * *